United States Patent
Jayanth et al.

(10) Patent No.: US 8,045,302 B2
(45) Date of Patent: Oct. 25, 2011

(54) COMPRESSOR PROTECTION AND GRID FAULT DETECTION DEVICE

(75) Inventors: Nagaraj Jayanth, Sidney, OH (US); George Ramayya, Sidney, OH (US)

(73) Assignee: Emerson Climate Technologies, Inc., Sidney, OH (US)

( * ) Notice: Subject to any disclaimer, the term of this patent is extended or adjusted under 35 U.S.C. 154(b) by 460 days.

(21) Appl. No.: 12/388,972

(22) Filed: Feb. 19, 2009

(65) Prior Publication Data

US 2009/0225479 A1    Sep. 10, 2009

Related U.S. Application Data

(60) Provisional application No. 61/030,105, filed on Feb. 20, 2008.

(51) Int. Cl.
H02H 7/09 (2006.01)
H02H 7/00 (2006.01)

(52) U.S. Cl. ............... 361/30; 361/56; 361/57; 361/31; 361/63; 361/93.1; 324/500; 324/511; 324/512; 324/522; 318/432; 318/434

(58) Field of Classification Search .............. 318/432, 318/434; 324/500, 511, 512, 522; 361/22, 361/30, 93.1, 31, 93.5, 93.6, 93.9, 93.8
See application file for complete search history.

(56) References Cited

U.S. PATENT DOCUMENTS

| | | | |
|---|---|---|---|
| 4,653,285 A * | 3/1987 | Pohl | 62/126 |
| 4,724,678 A * | 2/1988 | Pohl | 62/80 |
| 4,990,057 A | 2/1991 | Rollins | |
| 6,138,204 A * | 10/2000 | Amon et al. | 711/104 |
| 6,351,361 B1 * | 2/2002 | Kawazu et al. | 361/103 |
| 6,498,462 B2 * | 12/2002 | Ballantine et al. | 322/8 |
| 6,760,207 B2 * | 7/2004 | Wyatt et al. | 361/93.1 |
| 7,282,921 B2 * | 10/2007 | Sela et al. | 324/522 |
| 7,352,545 B2 * | 4/2008 | Wyatt et al. | 361/31 |
| 7,447,568 B2 * | 11/2008 | Christensen et al. | 700/298 |
| 7,940,506 B2 * | 5/2011 | Lewis | 361/94 |
| 2002/0141877 A1 | 10/2002 | Jayanth et al. | |
| 2006/0182635 A1 | 8/2006 | Jayanth | |
| 2008/0177678 A1 * | 7/2008 | Di Martini et al. | 705/412 |

OTHER PUBLICATIONS

Written Opinion regarding International Application No. PCT/US2009/034679 dated Oct. 16, 2009.
International Search Report dated Oct. 16, 2009 regarding International Application No. PCT/US2009/034679.
J. Carlos Haiad, Southern California Edison; ARI-ACEEE Energy Efficiency Summit; "A/C Unit Stalling Background Briefing"; Jul. 19-20, 2007.

* cited by examiner

*Primary Examiner* — Rita Leykin
(74) *Attorney, Agent, or Firm* — Harness, Dickey & Pierce, P.L.C.

(57) ABSTRACT

A compressor monitoring system includes current and voltage monitors, current and voltage averaging modules, a control module, and a switch. The current monitor measures a current drawn by a motor of a compressor. The current averaging module generates first and second average current values based on the current measured by the current monitor. The voltage monitor measures a utility power voltage. The voltage averaging module generates first and second average voltage values based on the voltage measured by the voltage monitor. The control module selectively generates a fault signal when a first ratio is greater than a first predetermined threshold and a second ratio is less than a second predetermined threshold. The first ratio is based on the first and second average current values. The second ratio is based on the first and second average voltage values. The switch deactivates the motor when the fault signal is generated.

25 Claims, 9 Drawing Sheets

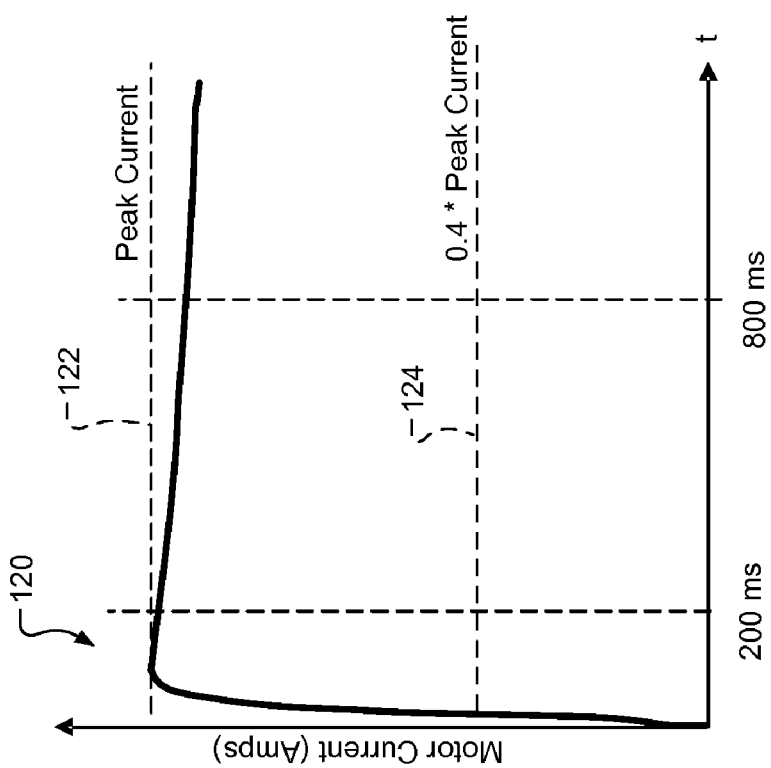
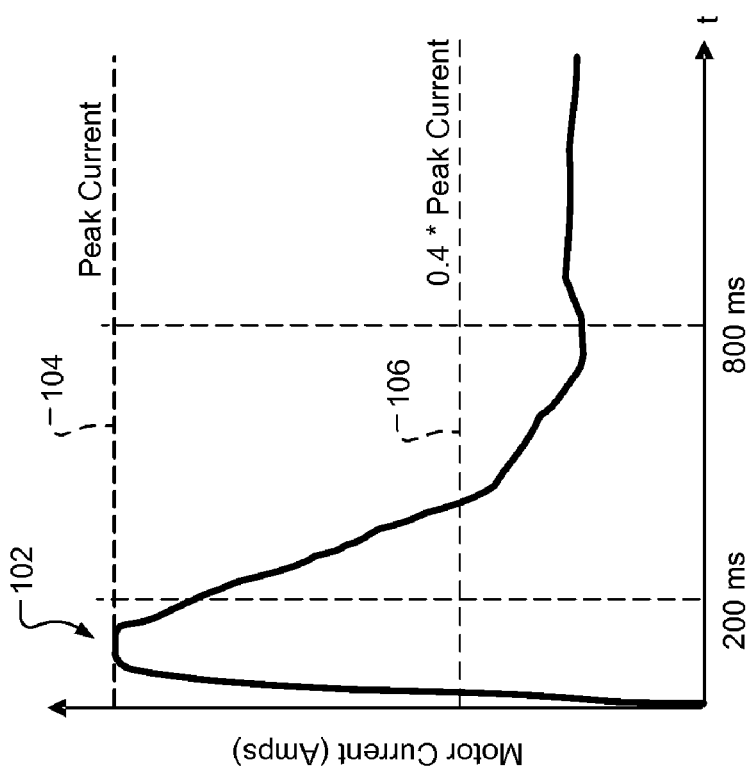
FIG. 1A
FIG. 1B

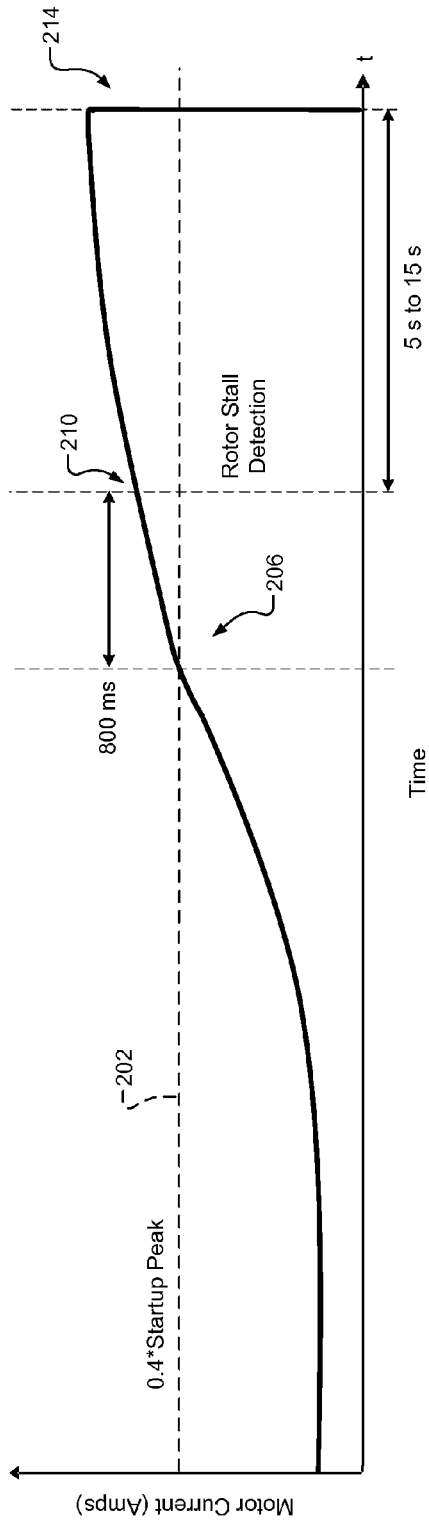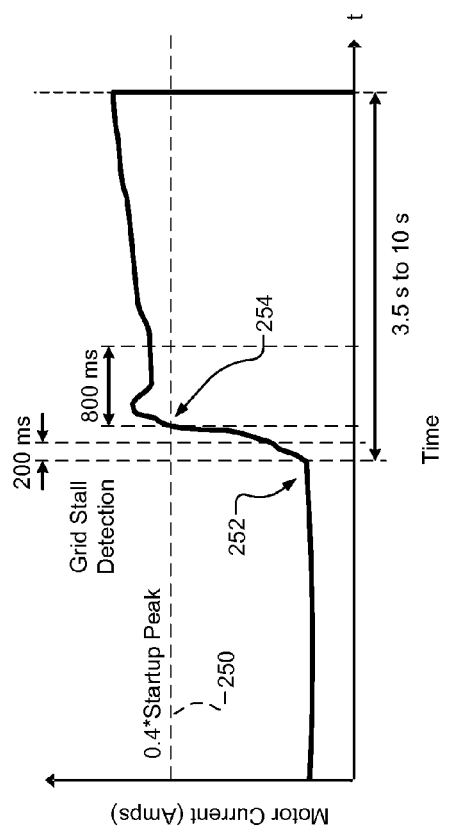
FIG. 2
FIG. 3

COMPRESSOR PROTECTION AND GRID FAULT DETECTION DEVICE

FIELD

The present disclosure relates to grid fault detection and compressor protection, and more particularly to low grid voltage detection.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Compressors are used in many residential and commercial settings, such as for heating, ventilation, and air conditioning (HVAC) systems and cooling/refrigeration systems. While starting, current drawn by the compressor is often high because the compressor motor's inductance has a very low resistance at low frequencies. As the speed of the motor increases, the current decreases.

However, as the voltage supplied to the compressor drops, the current increases. When power is provided to the compressor from an electrical grid, decreases in voltage of the electrical grid will cause the compressor's current to increase. A voltage decrease may occur on the grid in various circumstances, such as if a substation or transmission line fails. This voltage decrease may result in a dramatic increase in current drawn by the compressor.

SUMMARY

A compressor monitoring system includes current and voltage monitors, current and voltage averaging modules, a control module, and a switch. The current monitor measures a current drawn by a motor of a compressor. The current averaging module generates first and second average current values based on the current measured by the current monitor. The voltage monitor measures a utility power voltage. The voltage averaging module generates first and second average voltage values based on the voltage measured by the voltage monitor. The control module selectively generates a fault signal when a first ratio is greater than a first predetermined threshold and a second ratio is less than a second predetermined threshold. The first ratio is based on the first and second average current values. The second ratio is based on the first and second average voltage values. The switch deactivates the motor when the fault signal is generated.

In other features, the first ratio is based on the second average current value divided by the first average current value. The second ratio is based on the second average voltage value divided by the first average voltage value. The second average current and voltage values are generated after the first average current and voltage values. The first predetermined threshold is approximately 2. The second predetermined threshold is approximately 0.8.

In further features, the current averaging module generates each of the first and second average current values by averaging M contiguous current values from the current monitor. The voltage averaging module generates each of the first and second average voltage values by averaging N contiguous voltage values from the voltage monitor, wherein M and N are integers greater than one. M and N are equal to eight.

In still other features, each of the current values from the current monitor corresponds to a period of a periodic input power signal. Each of the voltage values from the voltage monitor corresponds to the period of the periodic input power signal. The second average current and voltage values are generated P periods after the first average current and voltage values, and wherein P is equal to one of M and N. The control module determines an operating current threshold and generates the fault signal when current values from the current monitor exceed the operating current threshold for a predetermined length of time. The control module sets the operating current threshold based on a peak startup current.

In other features, the control module determines the peak startup current based on a maximum one of the current values during a startup period of time after the motor starts. The startup period of time is approximately 200 ms. The predetermined length of time is approximately 800 ms. The control module generates the fault signal when the current value at an end of the startup period of time exceeds the operating current threshold. The control module determines the operating current threshold based on a product of the peak startup current and approximately 0.4.

In further features, the compressor monitoring system further comprises a mass flow sensor that measures a mass flow of gas in the compressor and outputs mass flow values. The control module generates the fault signal when the mass flow values decrease by more than a predetermined amount. The compressor monitoring system further comprises a temperature sensor that measures a temperature of the compressor and outputs temperature values. The control module generates the fault signal when a rate of change of the temperature values exceeds a predetermined rate.

In still other features, the compressor monitoring system further comprises a vibration sensor that determines a vibration profile of the compressor. The control module generates the fault signal when the vibration profile changes by more than a predetermined amount. The vibration profile includes a fundamental frequency of vibration. The compressor monitoring system further comprises a power factor monitoring module that determines a power factor of the motor and outputs power factor values. The control module generates the fault signal when the power factor values decrease by more than a predetermined amount.

A method comprises measuring a current drawn by a motor of a compressor; generating first and second average current values based on the measured current; measuring a utility power voltage; generating first and second average voltage values based on the measured voltage; determining a first ratio based on the first and second average current values; determining a second ratio based on the first and second average voltage values; selectively generating a fault signal when the first ratio is greater than a first predetermined threshold and the second ratio is less than a second predetermined threshold; and deactivating the motor when the fault signal is generated.

In other features, the method further comprises determining the first ratio based on the second average current value divided by the first average current value; and determining the second ratio based on the second average voltage value divided by the first average voltage value. The second average current and voltage values are generated after the first average current and voltage values. The first predetermined threshold is approximately 2. The second predetermined threshold is approximately 0.8.

In further features, the method further comprises generating each of the first and second average current values by averaging M contiguous current values; and generating each of the first and second average voltage values by averaging N contiguous voltage values, wherein M and N are integers greater than one. M and N are equal to eight. Each of the current values corresponds to a period of a periodic input power signal. The first and second voltage values correspond to the period of the periodic input power signal. The second average current and voltage values are generated P periods after the first average current and voltage values, and wherein P is equal to one of M and N.

In still other features, the method further comprises determining an operating current threshold; and generating the fault signal when current values from the current monitor exceed the operating current threshold for a predetermined length of time. The method further comprises setting the operating current threshold based on a peak startup current. The method further comprises determining the peak startup current based on a maximum one of the current values during a startup period of time after the motor starts. The startup period of time is approximately 200 ms. The predetermined length of time is approximately 800 ms.

In other features, the method further comprises generating the fault signal when the current value from the current monitor at an end of the startup period of time exceeds the operating current threshold. The method further comprises determining the operating current threshold based on a product of the peak startup current and approximately 0.4. The method further comprises measuring a mass flow of gas in the compressor; and generating the fault signal when measured mass flow decreases by more than a predetermined amount.

In further features, the method further comprises measuring a temperature of the compressor; and generating the fault signal when a rate of change of the measured temperature exceeds a predetermined rate. The method further comprises determining a vibration profile of the compressor; and generating the fault signal when the vibration profile changes by more than a predetermined amount. The vibration profile includes a fundamental frequency of vibration. The method further comprises determining a power factor of the motor; and generating the fault signal when the power factor decreases by more than a predetermined amount.

A compressor monitoring system comprises a current monitor, a voltage monitor, a power factor monitor, an averaging module, a control module, and a switch. The current monitor measures a current drawn by a motor of a compressor. The voltage monitor measures a voltage of the motor. The power factor monitor calculates a power factor of the motor based on the measured current and the measured voltage and generates power factor values. The averaging module generates a first average power factor value based on the power factor values and later generates a second average power factor value based on the power factor values. The control module selectively generates a fault signal when a ratio is less than a predetermined threshold. The control module calculates the ratio based on the second average power factor value divided by the first average power factor value. The switch deactivates the motor when the fault signal is generated.

In other features, the predetermined threshold is approximately 0.8. The averaging module generates each of the first and second average power factor values by averaging M contiguous power factor values, wherein M is an integer greater than one. M is equal to eight. Each of the power factor values corresponds to a period of a periodic input power signal. The averaging module generates the second average power factor value M periods after the first average power factor value.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1A is a graphical depiction of a compressor motor turn-on event;

FIG. 1B is a graphical depiction of a compressor motor turn-on event where a rotor of the compressor has stalled;

FIG. 2 is a graphical depiction of gradual motor failure during motor operation;

FIG. 3 is a graphical depiction of rapid motor current increase as may happen during a grid failure;

DETAILED DESCRIPTION

Figure 4:
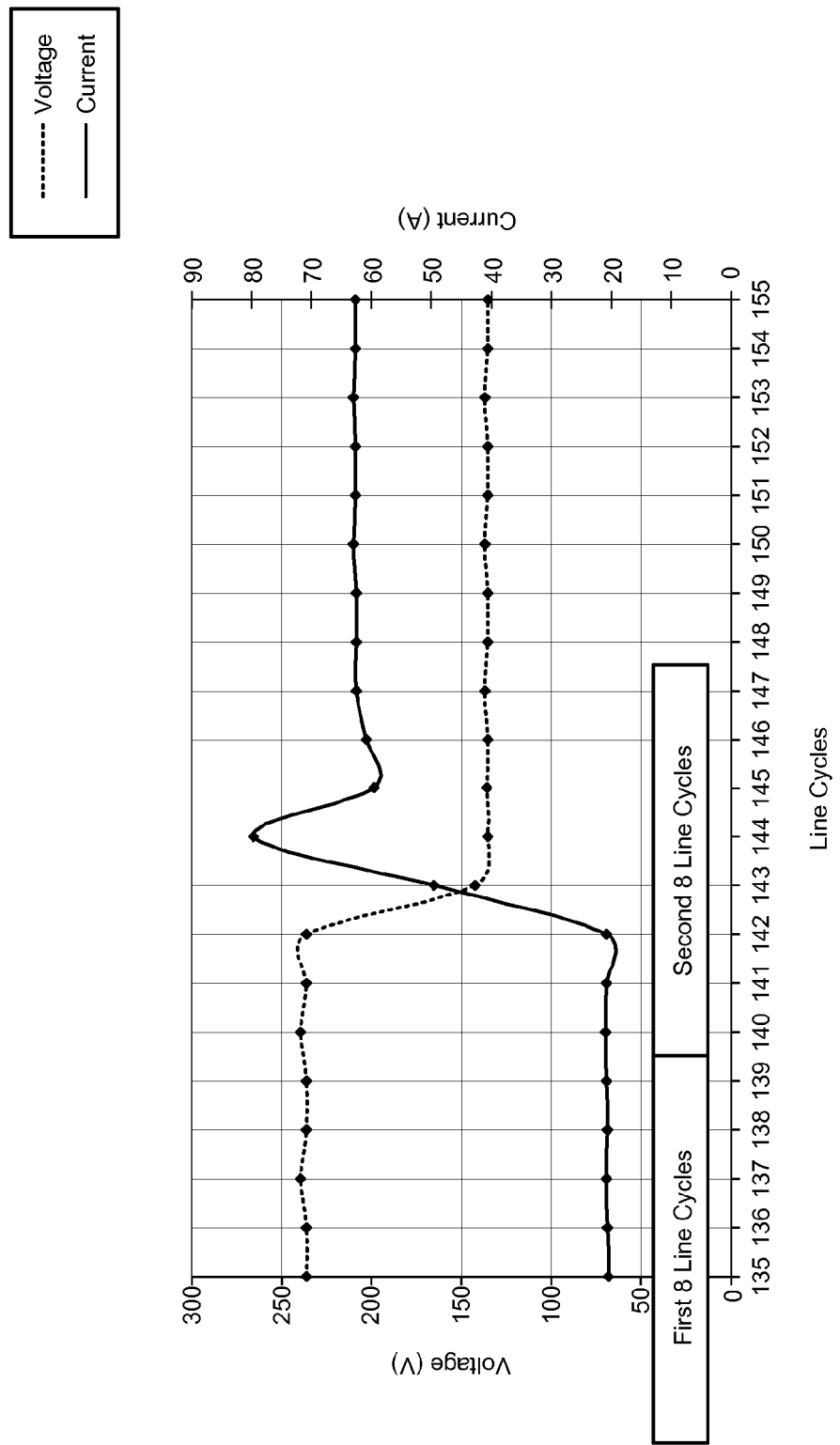
FIG. 4 is a graphical depiction of measured voltage and current for a compressor motor during a grid fault.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module refers to an electronic circuit, a processor (shared, dedicated, or group) and memory that execute one or more software or firmware programs, a combinational logic circuit, and/or other suitable components that provide the described functionality.

When a problem occurs within an electrical distribution grid, the grid voltage may decrease. This decrease in voltage causes compressors connected to the grid to increase their current draw rapidly. As there are often many compressors connected to the grid, the increase in current is amplified. The operator of the electrical grid may isolate a problem area, such as a failed substation or transmission line, and remove the problem area from the grid.

However, by the time the problem is isolated, the compressors may already be drawing such a large current that the remaining parts of the grid cannot meet the current requirements, causing the voltage to sag further. The positive feedback between voltage sagging and compressor current increasing causes the current to increase rapidly. At a certain voltage, compressors may begin to stall. A stalled compressor draws a large current, which may be similar to the current it would draw upon start-up.

Eventually, the high current heats the compressor to a point where a thermal protection circuit powers off the compressor. Before thermal protection turns off most of the compressors, the original electrical grid fault may have been remedied. In addition, supplemental generation facilities and/or energy storage facilities may have been brought online in an attempt to meet the increased current demand.

Once the compressors turn off due to thermal overload, the demand on the grid decreases. The presence of the supplemental facilities may then cause the electrical grid voltage to overshoot the desired grid voltage. The additional generation and storage facilities may then be deactivated to reduce the grid voltage. As the grid voltage is decreasing to the desired voltage, the compressors, which had previously powered down due to thermal overload, may have cooled enough to come online once more. This increased demand may trigger another low voltage event. These problems may be difficult to mitigate at the grid level, motivating the desire for a solution that applies to the individual compressor.

Referring now to FIG. 1A, a graphical depiction of a compressor motor turn-on event is presented. At time zero, the motor turns on, and the motor current quickly increases to a peak 102. The current at the peak 102 may define a peak current 104. During normal operation, the peak 102 may occur within a predetermined time, such as 200 milliseconds (ms). The peak current 104 may therefore be determined by determining the largest current value within that predetermined time.

An operating current threshold 106 may be defined. The operating current threshold 106 may be defined proportionally to the peak current 104. For example only, the operating current threshold 106 may be equal to 0.4 times the peak current 104. Alternatively, the operating current threshold 106 may be a predetermined value. During normal operation, the motor current remains below the operating current threshold 106. The motor current may typically fall from the peak current 104 to below the operating current threshold 106 within a predetermined time after start-up, such as 800 ms.

Referring now to FIG. 1B, a graphical depiction of a compressor motor turn-on event where a rotor of the compressor has stalled is presented. Upon start-up, the motor current increases to a peak 120. A peak current 122 is defined at the peak 120, and an operating current threshold 124 is determined. In FIG. 1B, the rotor of the compressor has stalled, and so the motor current does not drop below the operating current threshold 124 by a predetermined time, such as 800 ms. If the motor current has not dropped below the operating current threshold 124, a fault may be identified. Eventually, the high current would heat the compressor and trip thermal overload protection. However, the compressor can be powered off immediately upon identifying the fault.

Referring now to FIG. 2, a graphical depiction of gradual motor failure during motor operation is presented. At the left side of the graph, the motor is operating with a current below an operating current threshold 202. The motor current begins to increase, and eventually crosses the operating current threshold, as indicated at 206. A fault may immediately be declared if the current exceeds the operating current threshold 202. However, this may cause false positives when a transient causes the motor current to only briefly exceed the operating current threshold 202.

To prevent false positives, a delay may be defined. If the motor current remains above the operating current threshold 202 for the length of the delay, a fault may be declared. For example only, the length of the delay may be 800 ms. This value may correspond to the time at which the motor current has decreased from the peak current level, as shown in FIG. 1A, or may be determined independently.

As shown in FIG. 2, the motor current is still above the operating current threshold 202 after 800 ms, as indicated at 210. A fault may then be declared, and may be classified as a rotor stall event. Without the rotor stall detection, the motor current may continue to increase until the high current heats the compressor, and thermal overload eventually occurs, as indicated at 214.

Referring now to FIG. 3, a graphical depiction of rapid motor current increase, as may happen during a grid failure, is presented. At the left of FIG. 3, the motor current is below an operating current threshold 250. In response to a grid fault, which may cause a sudden decrease in grid voltage, the motor current begins to rapidly increase, as indicated at 252.

At 254, the motor current has exceeded the operating current threshold 250. When using rotor stall detection, such as is described above with respect to FIG. 2, the compressor will be turned off after 800 ms. Without rotor stall detection, the compressor may turn off due to thermal protection after between approximately 3.5 and 10 seconds. The fact that the current rises so rapidly may be used to identify a fault without waiting for the delay (such as 800 ms) of rotor stall detection.

For example, if a moving average of the current is calculated, and that moving average doubles, a fault may be declared and the compressor may be powered off. For example, a doubling of the current moving average may be ascertained within 200 ms. This fault may be characterized as a grid stall. Grid stalls may also be identified by decreases in voltage. For example, a grid stall may be identified when a moving average of current doubles while a moving average of voltage decreases by a percentage, such as 20 percent. Further measurements that may detect grid stalls, such as vibration, mass flow, temperature, and power factor, are discussed below with respect to FIG. 8.

The amount of decrease in voltage or increase in current used to identify grid faults may vary based upon the parameters of the grid and the characteristics of the compressor. For example, the percentage increase in current may be increased to prevent false positives, where a fault is identified when none exists. The current percentage may be decreased to prevent false negatives, where a grid fault is missed because it did not occur quickly enough. The chosen current percentage may balance these factors for a particular system. For example only, the current percentage may be approximately 100 percent or a greater or lesser value.

In addition, the percentage decrease in voltage may be chosen similarly. Identifying a stall only when a large percentage decrease occurs between adjacent averages may cause slower-occurring grid faults to be missed. Using a small percentage decrease may misidentify normal grid voltage changes as grid faults. For example only, the voltage percentage may be approximately 20 percent, approximately 30 percent, a value between 20 and 30 percent, or a greater or lesser value. For ease of explanation only, a current percentage of 100 percent and a voltage percentage of 20 percent will be described herein.

Referring now to FIG. 4, a graphical depiction of measured voltage and current for a compressor motor during a grid fault is presented. Each division along the x-axis may represent a line cycle. For example, with 50 Hertz (Hz) power, a line cycle occurs approximately every 20 ms. For 60 Hz power, a line cycle occurs approximately every 17 ms. A moving average may be calculated for both the voltage and the current.

For example only, the moving average may be performed over the last 8 line cycles. The moving average calculated at any point may be compared to the moving average calculated eight line cycles before. In other words, the windows that are being compared may be two consecutive eight-line-cycle windows. For example only, as shown in FIG. 4, after measurements of current and voltage have been performed at cycle 147, the moving averages for both voltage and current can be compared.

The most recent moving average covers the eight previous samples (line cycles 140-147), while the comparison moving average covered line cycles 132-139. It appears from FIG. 4 that the moving average of current for the second set of line cycles is double that for the first set of line cycles. In addition, the average of voltage for the second set of line cycles is more than 20 percent below the average for the first set of line cycles.

At the end of line cycle 147, a grid fault may therefore be declared, and the compressor shut down. The length of the moving average, the percentage increase in current, and the percentage decrease in voltage are presented for example only, and can be tailored for the application. In addition, they may be adapted based on such factors as previous grid faults and/or compressor operating conditions.

Figure 5A:
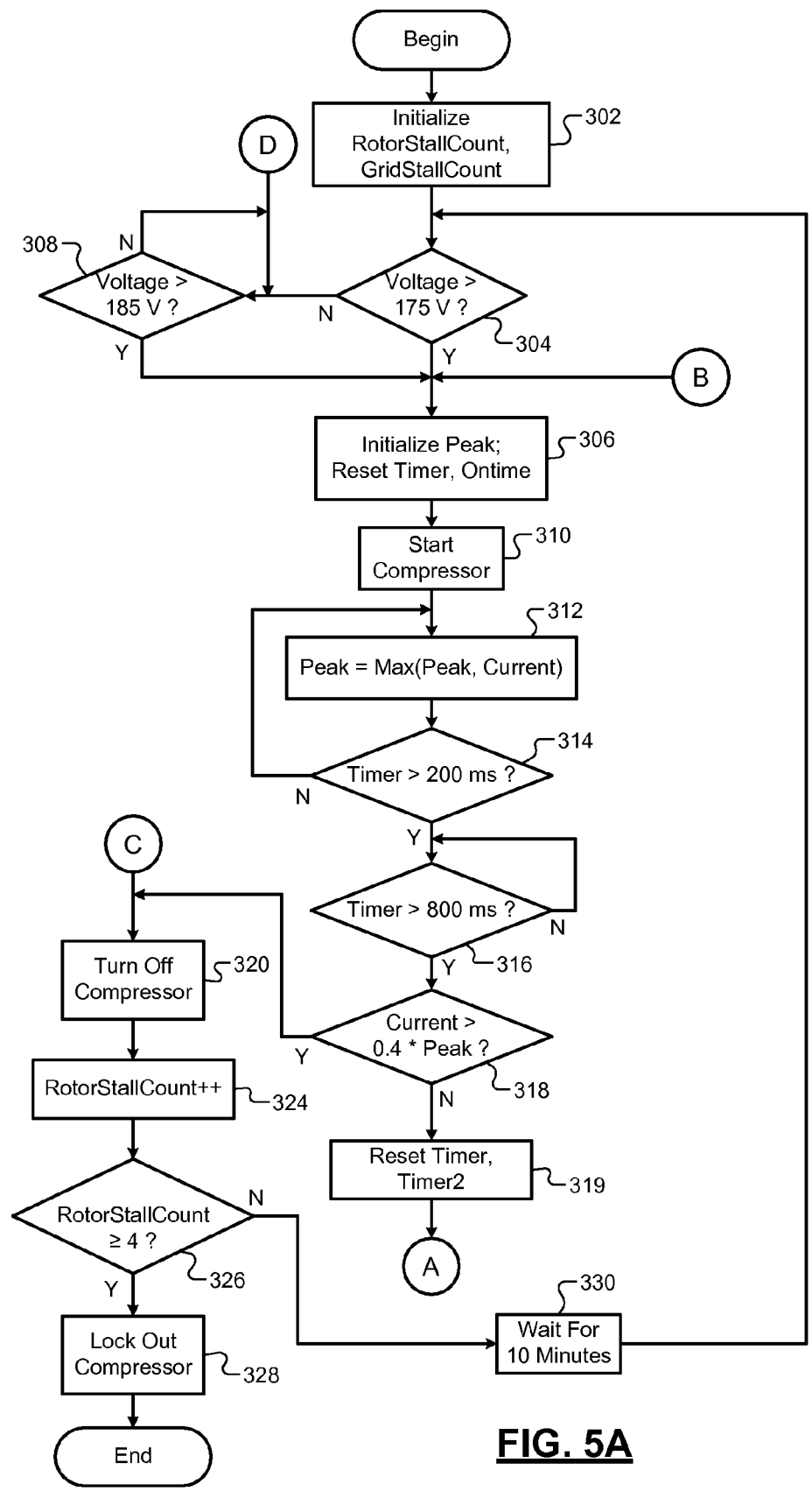
FIGS. 5A-5B are flowcharts depicting exemplary operation of a control system that implements rotor stall detection and grid stall detection.
Figure 5B:
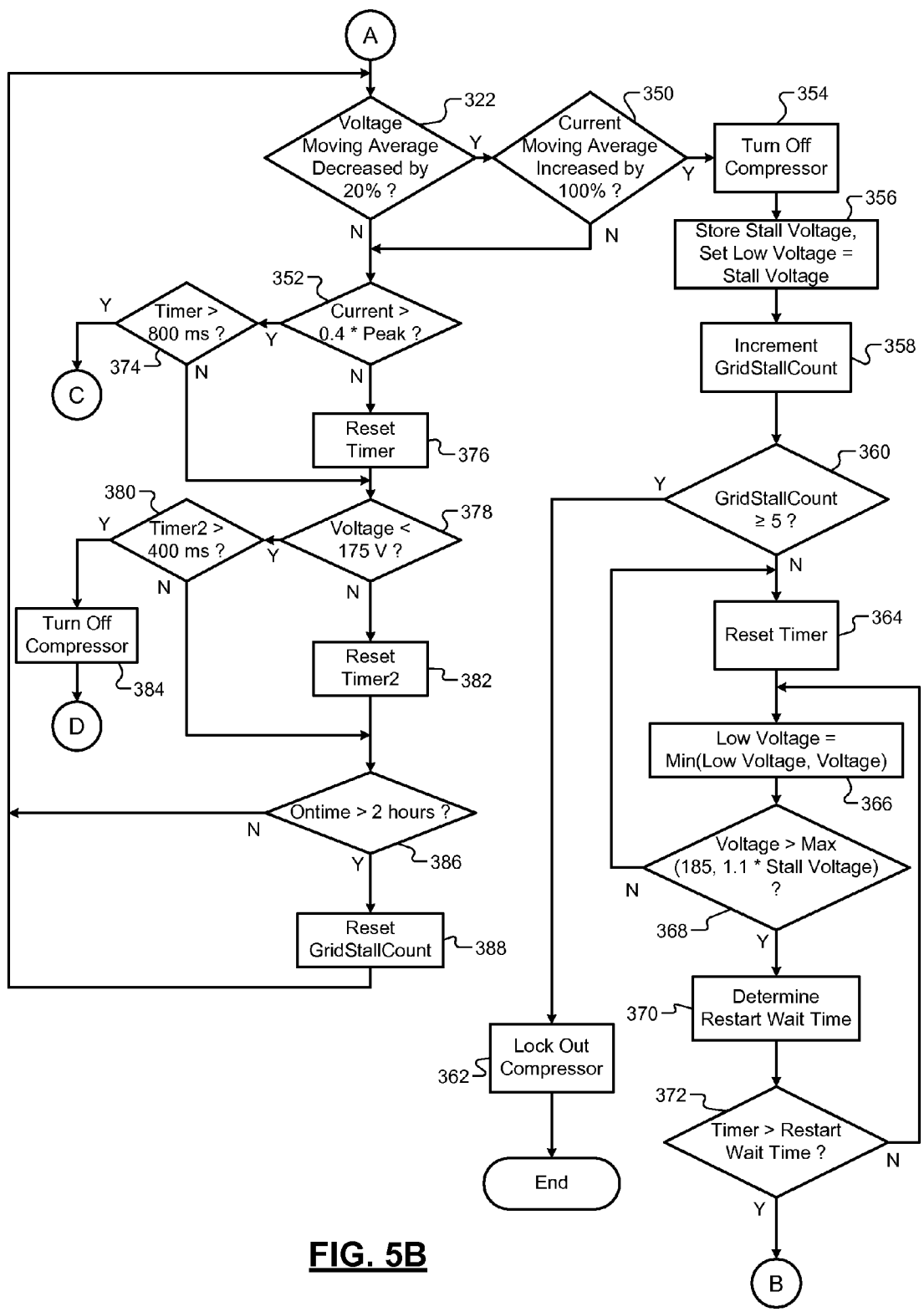

Referring now to FIGS. 5A-5B, flowcharts depict exemplary operation of a control system that implements rotor stall detection and grid stall detection. Control begins in step 302, where variables RotorStallCount and GridStallCount are initialized. RotorStallCount tracks the number of times that a rotor stall event has been declared.

RotorStallCount may be reset after a predetermined period of time where no rotor stall events have been declared. In addition, RotorStallCount may be reset by a service technician, either onsite or remotely. GridStallCount may track the number of grid faults that have been declared. GridStallCount may be reset after a predetermined period of time where no grid faults have been declared. Additionally, GridStallCount may be reset at times when RotorStallCount is reset.

Control continues in step 304, where control determines whether the measured voltage is greater than 175 Volts (V). If so, control continues in step 306; otherwise, control transfers to step 308. The comparison in step 304 is performed to ensure that there is adequate voltage to start the compressor.

The value of 175 V is presented for example only and may correspond to 240 V power. The value of 175 V may correspond to a value below which the compressor will stall and/or will draw substantially more current. In various implementations, step 304 may monitor the grid voltage for a predetermined period of time before continuing. For example, control may determine whether the grid voltage remains above 175 V for a predetermined period of time, such as 400 ms.

In step 308, control waits until the voltage increases above 185 V. Once the voltage increases above 185 V, control transfers to step 306; otherwise, control remains in step 308. In various implementations, control only transfers to step 306 after the voltage is above a threshold for a predetermined period of time. For example, control may transfer to step 306 after the voltage has been above 185 V for 15 seconds.

The predetermined period of time may be adjusted based on the lowest value measured for the grid voltage. Alternatively, the predetermined period of time may be adjusted based on the grid voltage measured in step 304. The predetermined period of time may be determined such that the compressor is not started before the grid voltage has stabilized at a sufficient level.

In step 306, a PeakCurrent variable is initialized. In addition, two timers, labeled Timer and Ontime, are reset. Timer is used to track various time periods, and Ontime is a measure of how long the compressor has been running. Control continues in step 310, where the compressor is started.

Control continues in step 312, where the maximum of PeakCurrent and the latest measured current value is stored back into PeakCurrent. Control continues in step 314, where control determines whether Timer has reached 200 ms. If so, control transfers to step 316; otherwise, control returns to step 312. This 200 ms value is presented for example only, and corresponds to the length of time within which the peak motor current should have been achieved.

In step 316, control determines whether Timer has exceeded 800 ms. If so, control transfers to step 318; otherwise, control remains in step 316. The value of 800 ms is presented for example only, and corresponds to the length of time within which the motor current should have fallen below the operating current threshold.

In step 318, the most recently measured current value is compared to the operating current threshold. For example, the operating current threshold may be defined as 0.4*PeakCurrent. If the most recently measured current value is above the operating current threshold, control transfers to step 320; otherwise, control continues in step 319.

In step 319, control resets Timer and a second timer (Timer2), and control continues via letter A in step 322 of FIG. 5B. In step 320, control turns off the compressor. Control continues in step 324, where RotorStallCount is incremented to reflect the detection of a rotor stall event. Control continues in step 326, where control determines whether RotorStallCount is greater than or equal to a predetermined threshold. If so, control transfers to step 328; otherwise, control continues in step 330. The value of 4 is presented for example only, and may reflect the number of times that a rotor stall may occur before a systemic problem is suspected.

In step 328, the compressor is locked out and control ends. Locking the compressor out may require a service call to determine the cause of the rotor stall events. This may be implemented according to safety regulations and/or safety policies of the manufacturer. In step 330, control waits for the motor to cool, and hopefully for the cause of the rotor stall to dissipate. For example, control may wait for ten minutes before attempting to restart the compressor. Control then continues in step 304.

Referring now to FIG. 5B, in step 322, control determines whether the moving average of the voltage has decreased by a percentage, such as 20 percent. If so, control transfers to step 350; otherwise, control transfers to step 352. In step 350, control determines whether the moving average of the current has increased by a percentage, such as 100 percent. If so, control transfers to step 354; otherwise, control transfers to step 352. In step 354, the moving average of the voltage has decreased by 20 percent and the moving average of the current has increased by 100 percent, and the compressor is therefore turned off.

Control continues in step 356, where the voltage measured when the compressor stalled is stored into a StallVoltage variable. In addition, the stalled voltage is saved as a LowVoltage variable. The stalled voltage may be recorded once the moving average of the current has increased by 100 percent. Alternatively, the stalled voltage may be recorded at some other point, such as when the moving average of the voltage has decreased by 20 percent. In addition, the stalled voltage may be determined at a point of inflection of the motor current, such as point 252 of FIG. 3.

Control continues in step 358, where GridStallCount is implemented. Control continues in step 360, where control determines whether GridStallCount is greater than or equal to a predetermined threshold. If so, control continues in step 362; otherwise, control continues in step 364. For example only, the predetermined threshold may be 5. This predetermined threshold may be established by the utility company and/or the manufacturer.

In step 362, the compressor is locked out, and control ends. GridStallCount may be reset remotely, such as by the utility company, and control may then resume at either step 302 or 304. In step 364, control resets Timer. Control continues in step 366. In step 366, control stores the minimum of LowVoltage and the most recently measured voltage back into LowVoltage.

Control continues in step 368, where control determines whether the most recently measured voltage is above a recovery threshold. The recovery threshold may be determined by the maximum of 185 V and 1.1*StallVoltage. The value 185 V is once again only an example, and may correspond to various implementations using 240 V power.

If StallVoltage, where the compressor began or continued to stall, is close to or above 185 V, 1.1*StallVoltage will be greater than the 185 V value. Control may then wait to restart the compressor until the voltage has increased ten percent beyond StallVoltage. If the voltage has increased above the recovery voltage, control transfers to step 370; otherwise, control returns to step 362. The value of ten percent is for example only, and the value chosen may be higher or lower than ten.

In step 370, control determines a wait time. The wait time may be determined based upon LowVoltage. For example, the wait time may be inversely related to LowVoltage. Alternatively, the wait time may be a predetermined constant, which may be determined by the utility company, the manufacturer, and/or the installation or repair technician. In addition, the wait time may be based on the present voltage and/or any other suitable parameter.

The wait time may also depend upon GridStallCount. For example, the wait time may increase, such as linearly or exponentially, with GridStallCount. For example only, the wait time may be determined using a random delay, where the parameters for the random delay depend upon the factors described above. For example, the random delay may be selected from a range between a lower and an upper limit. As GridStallCount increases, the upper limit may increase exponentially. If Timer is greater than the wait time, control returns to step 306 of FIG. 5A via letter B. This allows control to attempt to restart the compressor. If Timer has not yet reached the wait time, control returns to step 366.

Referring now to step 352, control determines whether the most recently measured current is greater than the operating current threshold. If so, control transfers to step 374; otherwise, control transfers to step 376. The operating current threshold may be defined as 0.4*startup peak current. In step 374, control determines if Timer is greater than 800 ms. If so, a stall event has been detected, and control transfers to step 320 of FIG. 5A via letter C. Otherwise, control transfers to step 378.

Rotor stall detection is used to determine whether the rotor has stalled upon startup. Rotor stall detection may also be useful once the compressor is running, even when grid fault detection is implemented. For example, a slow enough increase in motor current will not trigger the 100 percent increase of step 350. As such, step 374 will identify more gradual events such as rotor stalls.

In step 376, Timer is reset and control continues in step 378. In step 378, control determines whether the measured voltage is less than a predetermined value, such as 175 Volts. If so, control transfers to step 380; otherwise, control transfers to step 382. In step 380, control determines whether Timer2 is greater than a predetermined period of time, such as 400 ms. If so, control transfers to step 384; otherwise, control transfers to step 386.

In other words, control transfers to step 384 when the voltage has been below a threshold for a predetermined period of time. The exemplary value of 400 ms may be replaced by a value that reduces the occurrence of false fault detections during temporary voltage sags. In step 384, control turns off the compressor, and control continues in step 308 of FIG. 5A via letter D. In step 382, control resets Timer2, and continues in step 386.

In step 386, control determines whether OnTime is greater than two hours. If so, control transfers to step 388; otherwise, control returns to step 322. In step 388, GridStallCount is reset, and control returns to step 322. GridStallCount is therefore reset after a predetermined period of time has passed with the compressor remaining on. For example only, that predetermined period of time is shown as two hours in FIG. 5B. In this way, GridStallCount can be used to measure grid faults that are related to each other, and not spaced apart in time.

Figure 6:
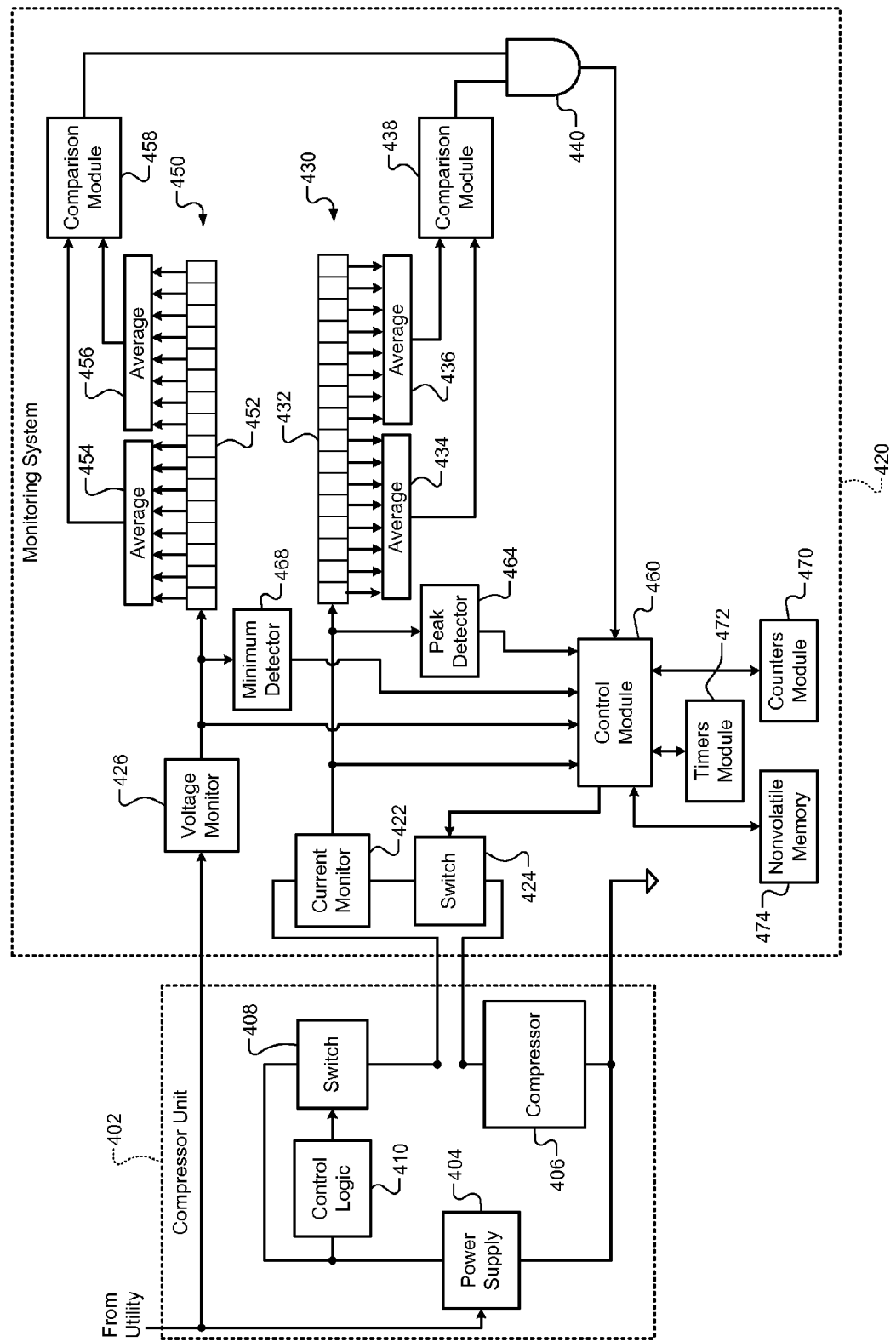
FIG. 6 is a functional block diagram of an exemplary implementation of a compressor system.

Referring now to FIG. 6, a functional block diagram of an exemplary compressor system according to the principles of the present disclosure is presented. A compressor unit 402 includes a power supply 404, a compressor 406, a switch 408, and control logic 410. The power supply 404 normally provides power to the compressor 406 via the switch 408.

The control logic 410, which may be powered by the power supply 404, controls the switch 408. The control logic 410 may control the switch 408 based upon a measured temperature and/or a command from a heating, ventilation, and air conditioning (HVAC) system. The compressor unit 402 may have been installed at a location without the monitoring system 420.

The monitoring system 420 may be later added to the compressor unit 402. The electrical connection between the switch 408 and the compressor 406 may be broken, and the current monitor 422 and a second switch 424 inserted between the switch 408 and the compressor 406. The monitoring system 420 may be grounded to the same ground as the compressor unit 402.

A voltage monitor 426 monitors the power grid voltage, as received from the utility. Alternatively, the voltage monitor 426 may monitor the output voltage of the power supply 404 and may be connected to either terminal of the current monitor 422 or of the second switch 424. The current monitor 422 outputs a current value to a shift register 430. The shift register 430 may include multiple shift cells 432. Each of these shift cells 432 may include multiple flip-flops for storing each bit of a digital current signal.

The digital current signal may be produced by an analog to digital converter, which may be located in the current monitor 422. The values stored in the shift register 430 may be read by first and second averaging modules 434 and 436. For example only, the shift register 430 may include eight shift cells 432, and the averaging modules 434 and 436 may each read four of the shift cells 432. In other implementations, the shift register 430 may include sixteen shift cells 432, and the averaging modules 434 and 436 may each read eight of the shift cells 432.

Outputs of the averaging modules 434 and 436 are received by a comparison module 438. The comparison module 438 generates an output signal, which is transmitted to an AND gate 440. The comparison signal may reflect whether the most recent average, from the averaging module 434, is more than twice that of a previous average, from the averaging module 436.

Similar to the implementation for current, the monitoring system 420 may include a second shift register 450, including multiple shift cells 452, that receives voltage values from the voltage monitor 426. Averaging modules 454 and 456 may receive values of the shift cells 452. A comparison module 458 compares output values from the averaging modules 454 and 456.

The comparison module 458 outputs a comparison signal to the AND gate 440. For example only, the comparison module 458 may generate the comparison signal based upon whether the most recent average, from the averaging module 454, is 20 percent lower than a previous average, from the averaging module 456. In various implementations, the monitoring system 420 may omit the voltage monitor 426 and associated components, such as the second shift register 452, the averaging modules 454 and 456, the comparison module 458, the AND gate 440, and the minimum detector 468.

The AND gate 440 outputs a result of a logical AND operation to a control module 460. The control module 460 controls the second switch 424, and may instruct the second switch 424 to open circuit its terminals when the value from the AND gate 440 is active. The control module 460 may also receive values from the current monitor 422, the voltage monitor 426, a peak detector 464, and a minimum detector 468.

For example only, the peak detector 464 may measure the peak current value from the current monitor 422. For example only, the minimum detector 468 may measure the minimum voltage value from the voltage monitor 426. The control module may store and access counters in a counter module 470, timers in a timer module 472, and values in a nonvolatile memory 474.

In addition, the nonvolatile memory 474 may store operating code and/or constants for use by the control module 460. For example only, the control module 460 may operate according to FIGS. 5A-B. Various functional blocks depicted in FIG. 6 may be implemented as software stored in the nonvolatile memory 474 and executed on a processor of the control module 460.

Figure 7:
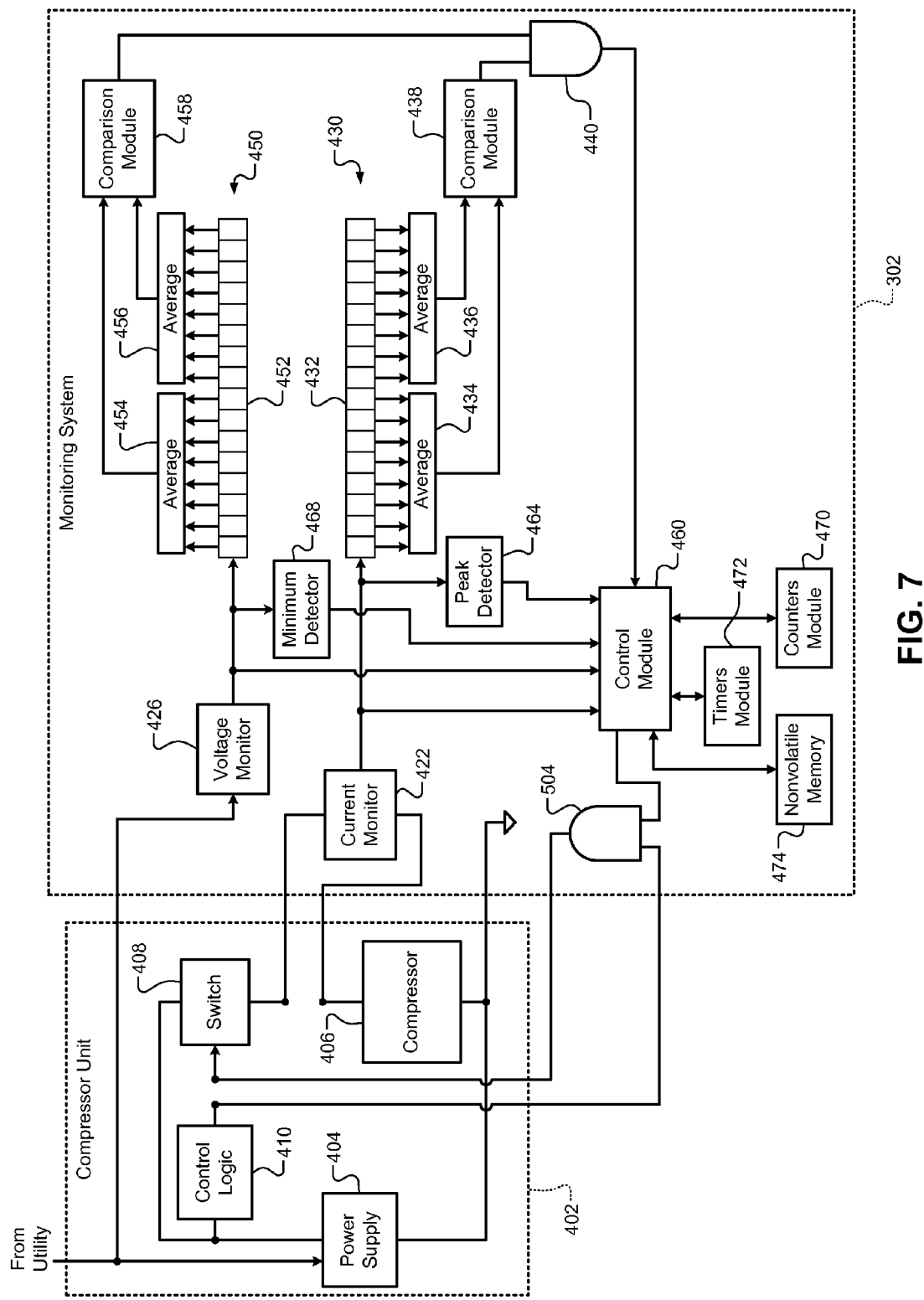
FIG. 7 is a functional block diagram of another exemplary implementation of a compressor system.

Referring now to FIG. 7, a functional block diagram of another exemplary implementation of a compressor system is presented. In FIG. 7, the electrical connection between the control logic 410 and the switch 408 is broken. The output of the control logic 410 is transmitted to a first input of a second AND gate 504. The output of the control module 460 is output to a second input of the second AND gate 504.

An output of the second AND gate 504 controls the switch 408. The current monitor 422 is still interposed between the switch 408 and the compressor 406. The AND gate 504 enables the switch 408 when the control logic 410 is attempting to turn the compressor 406 on and the control module 460 indicates that turning the compressor 406 on is acceptable.

Figure 8:
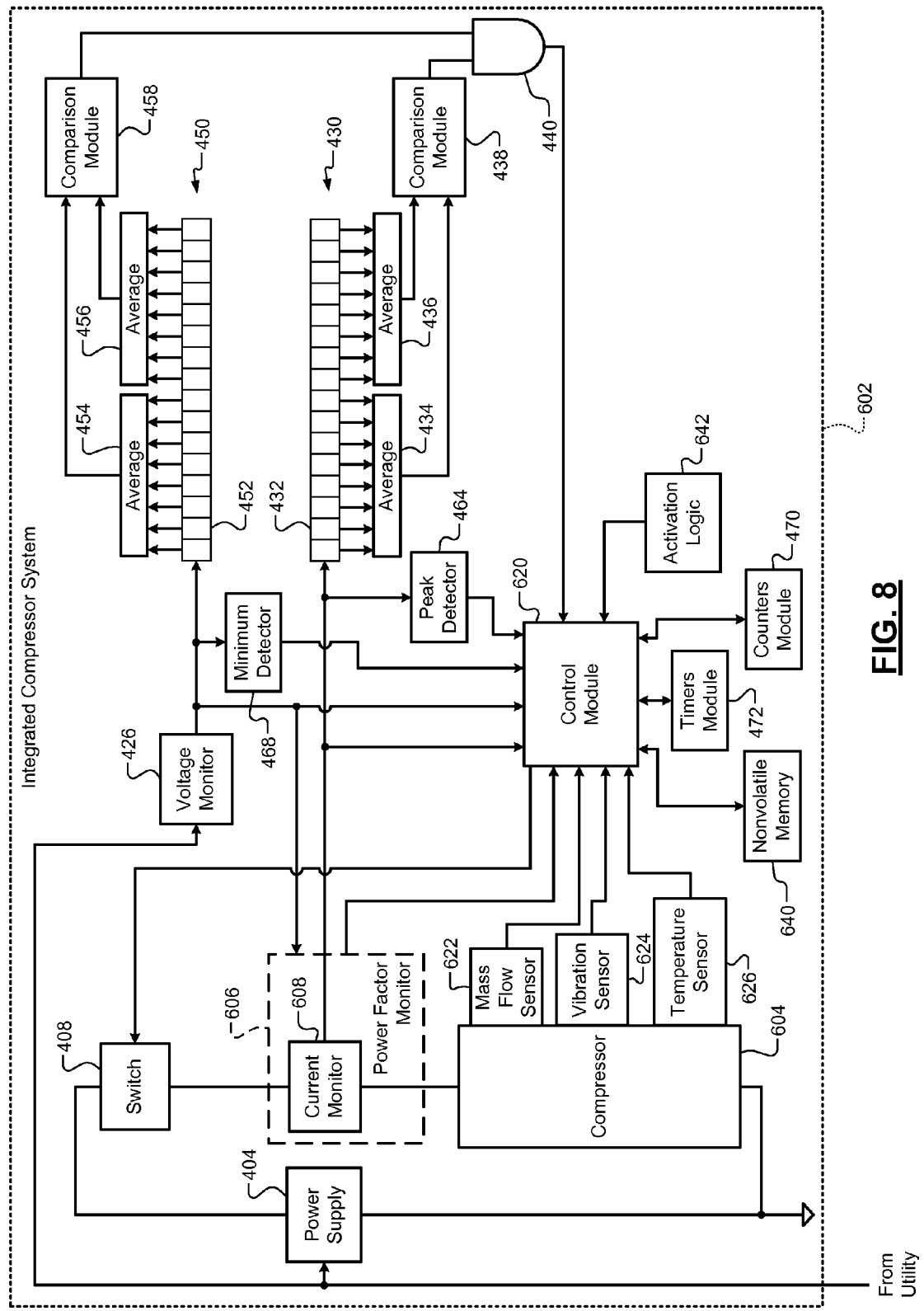
FIGS. 8-9 are functional block diagrams of exemplary integrated compressor systems.

Referring now to FIG. 8, a functional block diagram of an exemplary integrated compressor system 602 is presented. The integrated compressor system 602 may be manufactured as one or more units by an original equipment manufacturer. The power supply 404 provides power to a compressor 604, such as a scroll compressor, via the switch 408. A power factor monitor 606 may be interposed between the switch 408 and the compressor 604.

The power factor monitor 606 may include a current monitor 608. In addition, the power factor monitor 606 may include other components (not shown) to determine the power factor of the compressor 604. The power factor monitor 606 determines a current power factor based on the current and a voltage from the voltage monitor 426. The power factor monitor 608 transmits the power factor to a control module 620. The current monitor 608 transmits the measured current to the control module 620.

The compressor 604 may be monitored by various sensors. For example, a mass flow sensor 622 may monitor the mass of gas being compressed by the compressor 604. A vibration sensor 624 may measure vibration of the compressor 604. For example, the vibration sensor 624 may include an accelerometer and/or a gyroscope. A temperature sensor 626 may monitor temperature of the compressor 604. These monitored values may be received by the control module 620.

The control module 620 may also receive values from the voltage monitor 426, the minimum detector 468, and the peak detector 464. The control module 620 may execute code and/or use values from a non-volatile memory 640. The control module 620 receives a grid stall fault signal from the AND gate 440, which may cause the control module 620 to turn off the switch 408.

The integrated compressor system 602 may also include activation logic 642, which determines when the compressor 604 should be activated. The activation logic 642 may make activation decisions based on control by a thermostat and/or an HVAC controller. In various implementations, the control module 620 may implement the functions of the activation logic 642.

The control module 620 may detect grid faults using a variety of mechanisms. These mechanisms may be redundant and/or complementary. Various fault detection mechanisms may be omitted in favor of other fault detection mechanisms. The sensors and/or functional blocks associated with the omitted mechanisms may also be omitted.

In one exemplary fault detection mechanism, the AND gate 440 indicates when a moving average of voltage has changed by a predetermined amount and the moving average of the current has also changed by a predetermined amount. This may indicate that a grid fault has occurred.

The control module 620 may also determine that a grid fault has occurred when a value from the mass flow sensor 622 decreases. This decrease may be measured in absolute terms, relative terms, and/or as a rate of change. The control module 620 may also determine that a fault has occurred when a vibration characteristic sensed by the vibration sensor 624 has changed. For example, a change in the fundamental frequency of vibration may indicate that a fault is altering operation of the compressor 604. For example only, the vibration sensor 624 may perform a Fast Fourier Transform (FFT) and determine the frequency having the greatest magnitude.

In addition, a sudden change in temperature from the temperature sensor 626 and/or a change in the derivative of the temperature may indicate that a fault is present. In addition, a rapid change and/or decrease in power factor as monitored by the power factor monitor may indicate that a fault has occurred. In various implementations, a fault may be declared when any of these inputs indicate that a fault has occurred.

Further, the control module 620 may determine that a grid fault has occurred when a voltage from the voltage monitor 426 decreases by more than a predetermined amount and does not recover within a predetermined time period. For example only, the predetermined amount may be 40% or 50%. The predetermined time period may be an absolute time, such as 50 milliseconds, or may be a number of line cycles, such as three line cycles.

Alternatively, a fault may be declared once two or more methods have identified a fault. In addition, a time value may be associated with each fault detection mechanism implemented. If the fault is detected by various mechanisms within a predetermined period of time, the confidence in the presence of a fault may be increased. In addition, if an apparent fault has been sensed for a longer period of time, the confidence may increase.

Figure 9:
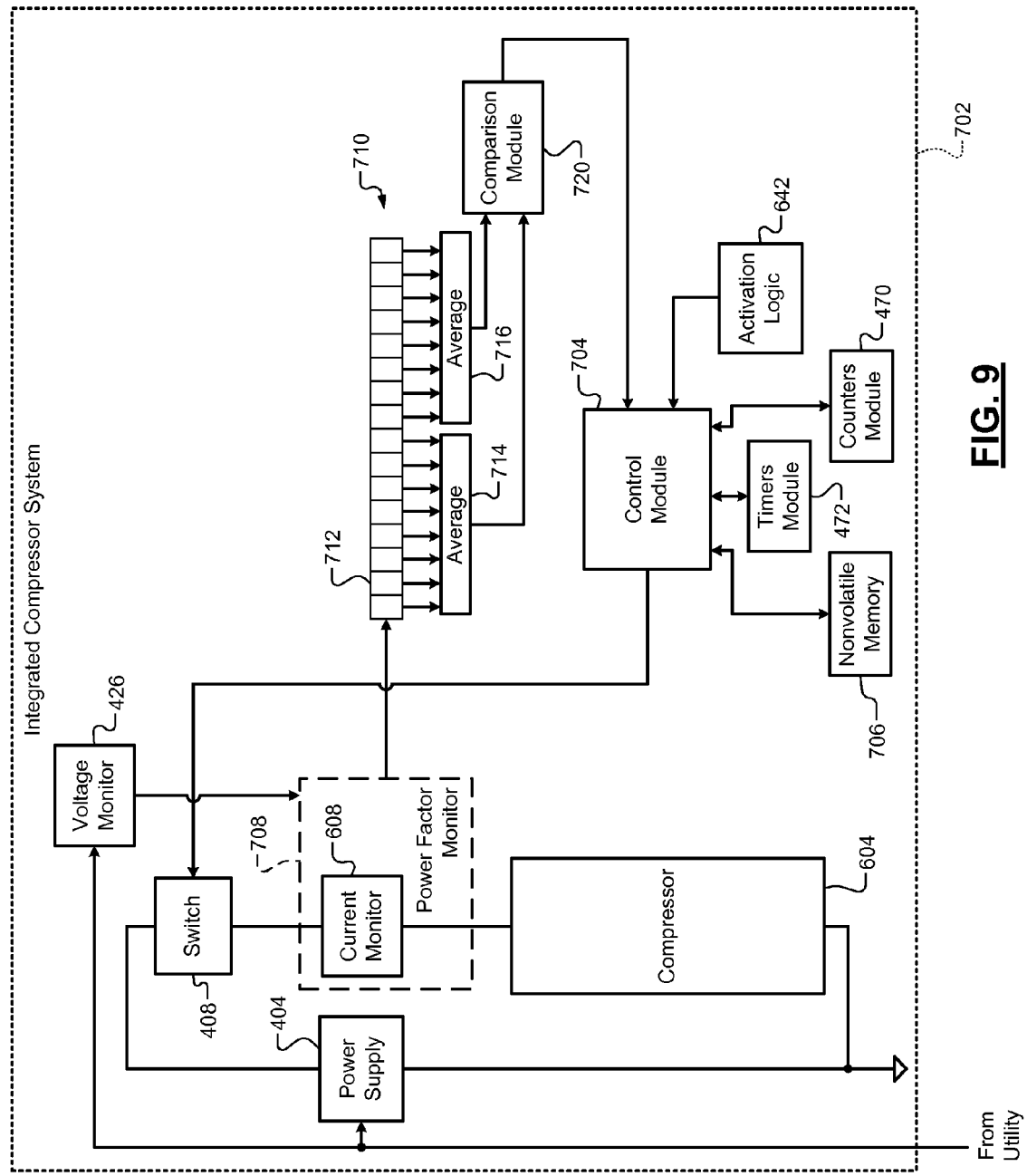

Referring now to FIG. 9, a functional block diagram of an exemplary integrated compressor system 702 is presented. A control module 704 executes code stored in a nonvolatile memory 706. A power factor monitor 708 determines a power factor. The power factor monitor 708 may determine the power factor based on current from the current monitor 608 and voltage from the voltage monitor 426.

The power factor monitor 708 outputs a power factor value to a shift register 710. The shift register 710 may include multiple shift cells 712. When the power factor value is an N-bit binary number, each of the shift cells 712 may include N flip-flops. The values stored in the shift register 710 are read by first and second averaging modules 714 and 716. In various implementations, the shift register 710 may include sixteen shift cells 712. The averaging modules 714 and 716 may each read eight of the shift cells 712.

The averaging modules 714 and 716 output averaged values to a comparison module 720. The averaged values may be updated after each new value is shifted into the shift register 710. The averaged values are therefore moving averages. The comparison module 720 may compare the averaged values each time they are updated. The comparison module 720 may calculate a ratio equal to the averaged value from the first averaging module 716 divided by the averaged value from the second averaging module 714.

When the ratio is less than a predetermined threshold, the comparison module 720 may output a power factor event indication to the control module 704. For example only, the predetermined threshold may be 0.8, which means that the averaged value has decreased by 20%. Based on the power factor event indication, the control module 704 may turn off the switch 408, thereby halting the compressor 604.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A compressor monitoring system comprising:
   a current monitor that measures a current drawn by a motor of a compressor;
   a current averaging module that generates first and second average current values based on the current measured by the current monitor;
   a voltage monitor that measures a utility power voltage;
   a voltage averaging module that generates first and second average voltage values based on the voltage measured by the voltage monitor; and
   a control module that selectively generates a fault signal when a first ratio is greater than a first predetermined threshold and a second ratio is less than a second predetermined threshold, wherein the first ratio is based on the first and second average current values, and wherein the second ratio is based on the first and second average voltage values.

2. The compressor monitoring system of claim 1 wherein the first ratio is based on the second average current value divided by the first average current value, wherein the second ratio is based on the second average voltage value divided by the first average voltage value, and wherein the second average current and voltage values are generated after the first average current and voltage values.

3. The compressor monitoring system of claim 2 wherein the first predetermined threshold is approximately 2 and wherein the second predetermined threshold is approximately 0.8.

4. The compressor monitoring system of claim 1 wherein the current averaging module generates each of the first and second average current values by averaging M contiguous current values from the current monitor, wherein the voltage averaging module generates each of the first and second average voltage values by averaging N contiguous voltage values from the voltage monitor, wherein M and N are integers greater than one.

5. The compressor monitoring system of claim 4 wherein M and N are equal to eight.

6. The compressor monitoring system of claim 4 wherein each of the current values from the current monitor corresponds to a period of a periodic input power signal, wherein each of the voltage values from the voltage monitor corresponds to the period of the periodic input power signal, wherein the second average current and voltage values are generated P periods after the first average current and voltage values, and wherein P is equal to one of M and N.

7. The compressor monitoring system of claim 1 wherein the control module determines an operating current threshold and generates the fault signal when current values from the current monitor exceed the operating current threshold for a predetermined length of time.

8. The compressor monitoring system of claim 7 wherein the control module sets the operating current threshold based on a peak startup current.

9. The compressor monitoring system of claim 8 wherein the control module determines the peak startup current based on a maximum one of the current values during a startup period of time after the motor starts, wherein the startup period of time is approximately 200 ms, and wherein the predetermined length of time is approximately 800 ms.

10. The compressor monitoring system of claim 9 wherein the control module generates the fault signal when the current value at an end of the startup period of time exceeds the operating current threshold.

11. The compressor monitoring system of claim 8 wherein the control module determines the operating current threshold based on a product of the peak startup current and approximately 0.4.

12. A method performed by a compressor monitoring system, comprising:
    measuring a current drawn by a motor of a compressor;
    generating first and second average current values based on the measured current;
    measuring a utility power voltage;
    generating first and second average voltage values based on the measured voltage;
    determining a first ratio based on the first and second average current values;
    determining a second ratio based on the first and second average voltage values; and
    selectively generating a fault signal when the first ratio is greater than a first predetermined threshold and the second ratio is less than a second predetermined threshold.

13. The method of claim 12 further comprising:
    determining the first ratio based on the second average current value divided by the first average current value; and
    determining the second ratio based on the second average voltage value divided by the first average voltage value, wherein the second average current and voltage values are generated after the first average current and voltage values.

14. The method of claim 13 wherein the first predetermined threshold is approximately 2 and wherein the second predetermined threshold is approximately 0.8.

15. The method of claim 12 further comprising:
generating each of the first and second average current values by averaging M contiguous current values; and
generating each of the first and second average voltage values by averaging N contiguous voltage values, wherein M and N are integers greater than one.

16. The method of claim 15 wherein M and N are equal to eight.

17. The method of claim 15 wherein each of the current values corresponds to a period of a periodic input power signal, wherein the first and second voltage values correspond to the period of the periodic input power signal, wherein the second average current and voltage values are generated P periods after the first average current and voltage values, and wherein P is equal to one of M and N.

18. The method of claim 12 further comprising:
determining an operating current threshold; and
generating the fault signal when the measured current values exceed the operating current threshold for a predetermined length of time.

19. The method of claim 18 further comprising setting the operating current threshold based on a peak startup current.

20. The method of claim 19 further comprising determining the peak startup current based on a maximum one of the current values during a startup period of time after the motor starts, wherein the startup period of time is approximately 200 ms, and wherein the predetermined length of time is approximately 800 ms.

21. The method of claim 20 further comprising generating the fault signal when the measured current value at an end of the startup period of time exceeds the operating current threshold.

22. The method of claim 19 further comprising determining the operating current threshold based on a product of the peak startup current and approximately 0.4.

23. A compressor monitoring system comprising:
a current monitor that measures a current drawn by a motor of a compressor;
a voltage monitor that measures a voltage of the motor;
a power factor monitor that calculates a power factor of the motor based on the measured current and the measured voltage and generates power factor values;
an averaging module that generates a first average power factor value based on the power factor values and that later generates a second average power factor value based on the power factor values; and
a control module that selectively generates a fault signal when a ratio is less than a predetermined threshold, wherein the control module calculates the ratio based on the second average power factor value divided by the first average power factor value.

24. The compressor monitoring system of claim 1 further comprising a switch that deactivates the motor when the fault signal is generated.

25. The method of claim 12 further comprising deactivating the motor when the fault signal is generated.

* * * * *